United States Patent [19]
Bolandi et al.

[11] Patent Number: 5,983,644
[45] Date of Patent: Nov. 16, 1999

[54] INTEGRATED BAKE AND CHILL PLATE

[75] Inventors: Hooman Bolandi, Santa Clara; Avi Tepman, Cupertino, both of Calif.

[73] Assignee: Applied Materials, Inc., Santa Clara, Calif.

[21] Appl. No.: 08/939,926

[22] Filed: Sep. 29, 1997

[51] Int. Cl.⁶ ..................................................... F25B 21/02
[52] U.S. Cl. ................................... 62/3.2; 62/3.3; 62/3.7
[58] Field of Search ................................. 62/3.2, 3.3, 3.7

[56] References Cited

U.S. PATENT DOCUMENTS

| | | | |
|---|---|---|---|
| 5,363,746 | 11/1994 | Gordon | 99/328 |
| 5,431,700 | 7/1995 | Sloan | 29/25.01 |
| 5,611,264 | 3/1997 | Studer | 99/340 |
| 5,802,856 | 9/1998 | Schaper et al. | 62/3.7 |

*Primary Examiner*—Henry Bennett
*Assistant Examiner*—Mark Shulman
*Attorney, Agent, or Firm*—Arnold, White and Durkee

[57] ABSTRACT

A method and apparatus for providing integrated bake and chill thermal cycling applied to a material substrate is provided. The apparatus is a module comprising an integrated bake and chill plate with one or more fluid channels in a generally spiraling arrangement. The fluid channels have inlets and outlets near the center and perimeter of the integrated bake and chill plate. Additionally, the fluid channels can have microchannels through portions thereof. The module can also comprise one or more thermoelectric devices, a thermally conductive plate on which the substrate directly or indirectly rests, a printed circuit board, and a variable power source. The integrated bake and chill plate, the thermally conductive plate and the thermoelectric devices are all in thermal contact with each other. The thermoelectric devices are also in electrical contact with the variable power source and comprise a top plate, a bottom plate, a support positioned between the top and bottom plates, and one or more copper pads beneath the bottom plate for establishing electrical contact. The module bakes and chills a substrate by flowing fluids of different temperatures through the generally spiraling fluid channels and adjusting the temperature of the thermoelectric devices according to a preprogrammed cycle. Different fluid flow patterns can be chosen where fluid enters near the center of the integrated bake and chill plate and drains near the perimeter, where fluid enters near the perimeter and drains near the center, or where the two patterns are combined.

19 Claims, 4 Drawing Sheets

INTEGRATED BAKE AND CHILL PLATE

FIELD OF THE INVENTION

This invention relates generally to methods and apparatuses for providing integrated bake and chill thermal cycling applied to material substrates. More particularly, it relates to an integrated bake and chill thermal cycling module having improved fluid channels and structural design for providing controlled thermal cycling of material substrates such as semiconductor wafers and flat panel displays.

BACKGROUND OF THE INVENTION

Certain stages of semiconductor manufacturing require baking the semiconductor substrate material, such as a wafer, and subsequently chilling it. For example, the photoresist processing state of semiconductor manufacturing requires such baking and chilling, or thermal cycling. In order to produce high quality wafers suitable for present integrated circuit applications, the temperature of the wafer during this thermal cycling must be precisely controlled with respect to both the temporal temperature profile of the baking and chilling cycles and to the uniformity of the temperature across the substrate.

The conventional method for baking and chilling wafers involves first baking the wafer at a temperature ranging typically between 70° C. and 250° C. for a period of time ranging typically between 30 seconds and 90 seconds. After baking the wafer, the wafer is mechanically moved to a cold plate where it is chilled to a temperature ranging typically between 0° C. and 30° C.

There are several disadvantages of the above method. First, moving a wafer through the air between the hot and cold plates subjects the wafer to uncontrolled temperature variations during the bake and chill cycles. Moreover, the time required to move the wafer between the bake and chill plates prevents the realization of very short thermal transition times between thermal cycles. Finally, mechanically moving the wafer from the hot plate to the cold plate can contaminate or otherwise damage the wafer.

Attempts have been made to overcome the disadvantages of separate bake and chill plates. One apparatus places the hot plate upside down and directly above the cold plate. Because the wafer moves only a short distance from the cold plate directly upward to the hot plate, the apparatus reduces the uncontrolled and nonuniform temperature fluctuations normally present during the transition from the baking step to the chilling step. Nevertheless, because the wafer must be moved between separate bake and chill plates, the wafer is still subjected to uncontrolled and nonuniform temperature fluctuations during thermal cycling. Moreover, physical movement inhibits short thermal transition times. Finally, the wafer may still be exposed to contaminates or otherwise damaged during the physical movements from the hot plate to the cold plate.

Accordingly, the present invention provides an improved apparatus for the thermal cycling of material substrates such as wafers used in the manufactures of semiconductors. In particular, the present invention provides an improved apparatus for thermal cycling that eliminates the need to move the substrate between distinct bake or chill plates and that provides improved continuous control of substrate temperature throughout the entire baking and chilling cycle. Further features and advantages of the invention will be apparent from the following description and drawings.

SUMMARY OF THE INVENTION

The present invention provides a single thermally conductive plate for baking and chilling a substrate such as a wafer. Because the substrate is not moved during the entire baking and chilling cycle, the invention avoids problems associated with the transfer of the substrate between separate bake and chill plates. Another feature of the present invention is the use of a thinner plate for baking and chilling the substrate. A thinner plate provides an advantage of relatively thicker plates used previously due to the thinner plates lower thermal mass. Accordingly, the thinner plate provides for more efficient heat transfer.

The integrated bake and chill plate of the present invention contains one or more fluid channels that wind around a center point, gradually receding from the center point until reaching the perimeter in a square-like, rectangular-like, triangular-like, circular or other geometric pattern. The fluid channels permit thermally conductive fluids of pre-selected temperatures to be introduced at the perimeter of the integrated bake and chill plate and drained at the center or introduced at the center of the integrated bake and chill plate and drained at the perimeter. This design facilitates different flows and counterflows, which compensates for different heat transfer at the perimeter of the integrated bake and chill plate versus the center of the integrated bake and chill plate. In addition, the integrated bake and chill plate also can contain microchannels throughout portions of the fluid channels. The microchannels provide a larger pressure drop within the fluid channels thereby increasing the velocity of the thermally conductive fluid. The greater velocity inhibits the development of areas of nonuniform heat transfer in the integrated bake and chill plate. Additionally, the microchannels add stiffness to the integrated bake and chill plate, thereby reducing the potential for warping of the plate.

To improve the precision and uniformity of the plate's temperature, the present invention further comprises one or more thermoelectric devices (TEDs) in thermal contact with the thermally conductive plate. Because the TEDs may be quickly and precisely adjusted to heat the plate, they improve the control of the plate temperature and provide for shortened plate temperature transition times. Moreover, independently controlling an array of TEDs allows for compensation of spatial nonuniformities in substrate temperature that might arise. Alternatively, such independent control can provide intentional temperature nonuniformities if desired for special processing purposes.

The present invention also comprises a design facilitating easy replacement of individually damaged TEDs. The TEDs are attached with a connector, such as a screw or bolt, through a hole located in the center of the TED. This design also improves the electrical connection between the TED and a variable power source and the thermal connection between the thermally conductive plate and each TED.

BRIEF DESCRIPTION OF THE DRAWINGS

The advantages, features and design of the invention will become apparent from the following detailed description of the invention and the accompanying drawings in which like reference numerals refer to like elements and in which.

DETAILED DESCRIPTION OF THE INVENTION

The present invention provides a single thermally conductive plate for baking and chilling a substrate such as a wafer. Because the substrate is not moved during the entire baking and chilling cycle, the invention avoids problems associated with the transfer of the substrate between separate bake and chill plates. Another feature of the present invention is the use of a thinner plate for baking and chilling the substrate. A thinner plate provides an advantage over relatively thicker plates used previously due to the thinner plate's lower thermal mass. Accordingly, the thinner plate provides for more efficient heat transfer.

Figure 1:
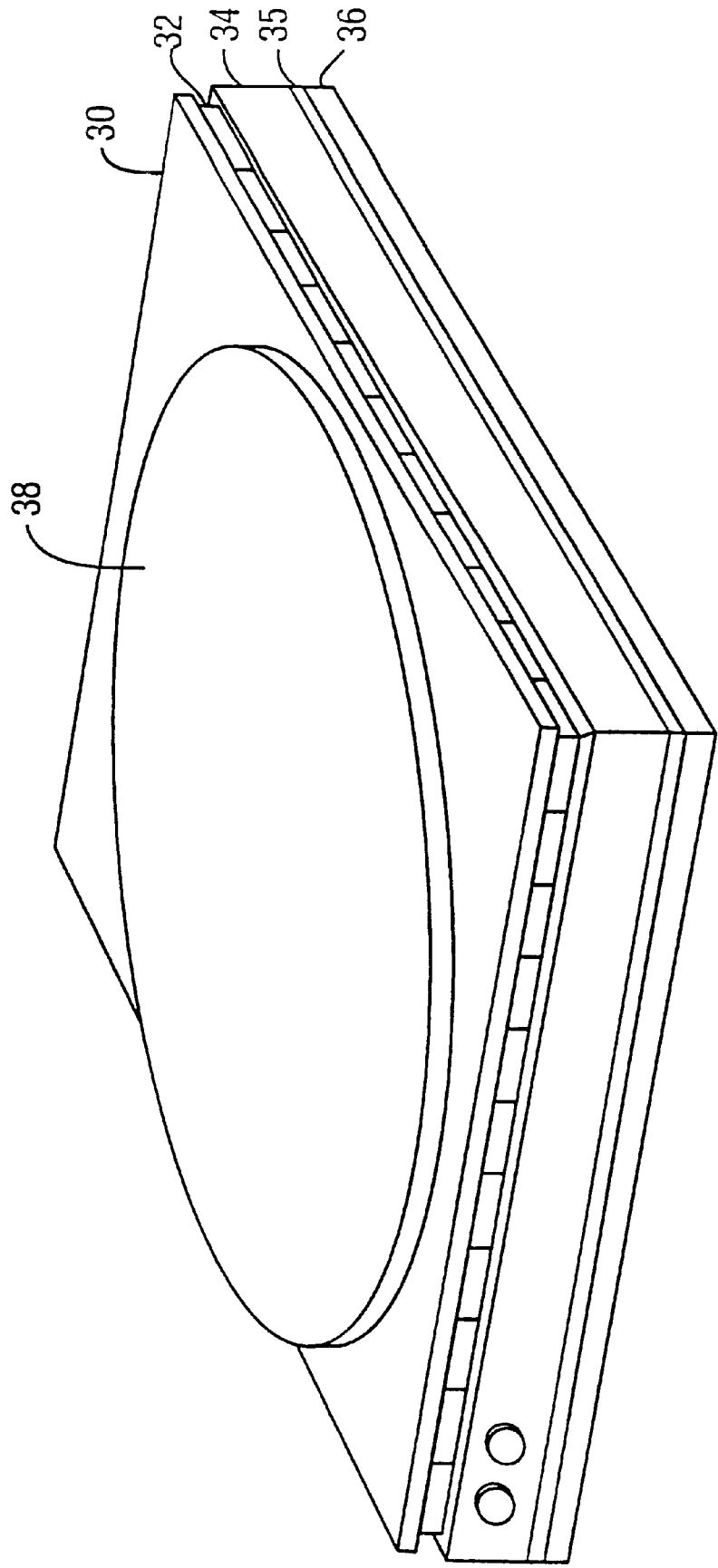
FIG. 1 is a perspective view of a preferred embodiment of the present invention.

Referring to FIG. 1, a substrate 38, such as a semiconductor wafer or flat panel display, is baked and chilled through thermal contact with a thermally conductive plate 30. Thermal contact includes physical proximity or direct physical contact sufficient to permit the transfer of heat. Both methods of establishing thermal contact are well known in the art and include positioning the substrate approximately 0.005–0.006 inches from the plate, or holding the substrate directly against the plate with a vacuum line, electrostatic clamp or gravity. It will be appreciated by anyone skilled in the art that although the present description uses physical proximity thermal contact for purposes of definiteness, any of the known methods of thermal contact may be used. In another preferred embodiment, the thermally conductive plate 30 has vertical extensions from its bottom surface that extend to make thermal contact with an integrated bake and chill plate 34.

The thermally conductive plate 30 is preferably made of a ⅛ or 3/16 inch thick piece of aluminum, aluminum nitride or other suitable ceramic or metal. The thinner plate provides an advantage over relatively thicker plates used previously due to the thinner plates lower thermal mass, which provides for more efficient heat transfer. Positioned on the other side of plate 30 is an array of thermoelectric devices (TEDs) 32 capable of heating. The TEDs 32 can be controlled to increase or decrease the amount of heat applied to the thermally conductive plate. Furthermore, when multiple TEDs 32 are used and individually controlled, one region of the plate 30 and substrate 38 can be heated or cooled in a different manner from another region. Thermal grease can be placed between the plate 30 and TEDs 32 to act as a conductive interface and improve the thermal contact. In a preferred embodiment, there are no spaces between the TEDs 32. In another preferred embodiment there are varying spaces between the TEDs to allow vertical extensions of the thermally conductive plate 30 to rest between the TEDs and make direct contact with an integrated bake and chill plate 34.

Beneath the layer of TEDs 32 is an integrated bake and chill plate 34 in thermal contact with the TEDs 32 and with the thermally conductive plate 30. While the integrated bake and chill plate 34 shown in FIG. 1 has a square shape across a horizontal plane, the plate 34 could also have a circular, oval or other shape. In a preferred embodiment, the integrated bake and chill plate 34 also has receiving ribs that are integrally connected to the top surface of the integrated bake and chill plate to receive the vertical extensions of the thermally conductive plate 30 thereby improving thermal conductivity between the integrated bake and chill plate 34 and thermally conductive plate 30 and reducing the potential for the plate 30 to warp. Preferably, thermal grease is also placed between the TEDs 32 and integrated bake and chill plate 34 to act as a conductive interface.

Beneath the integrated bake and chill plate 34, in a preferred embodiment, is a layer of insulation 35. Then, beneath the insulation layer 35 is a printed circuit board (PCB) 36. Any variable power source can be connected to the TEDs 32, but the preferred embodiment is to connect the TEDs 32 to a variable power source through the PCB 36. The TEDs 32 can be individually controlled by the PCB 36.

The integrated bake and chill plate of the present invention contains one or more fluid channels that wind around a center point, gradually receding from the center point until reaching the perimeter in a square-like, rectangular-like, triangular-like, circular or other geometric pattern. The fluid channels permit thermally conductive fluids of pre-selected temperatures to be introduced at the perimeter of the integrated bake and chill plate and drained at the center or introduced at the center of the integrated bake and chill plate and drained at the perimeter. This design facilitates different flows and counterflows, which compensates for different heat transfer at the perimeter of the integrated bake and chill plate versus the center of the integrated bake and chill plate. In addition, the integrated bake and chill plate also can contain microchannels throughout portions of the fluid channels. The microchannels provide a larger pressure drop within the fluid channels thereby increasing the velocity of the thermally conductive fluid. The greater velocity inhibits the development of areas of nonuniform heat transfer in the integrated bake and chill plate. Additionally, the microchannels add stiffness to the integrated bake and chill plate, thereby reducing the potential for warping of the plate.

Figure 2:
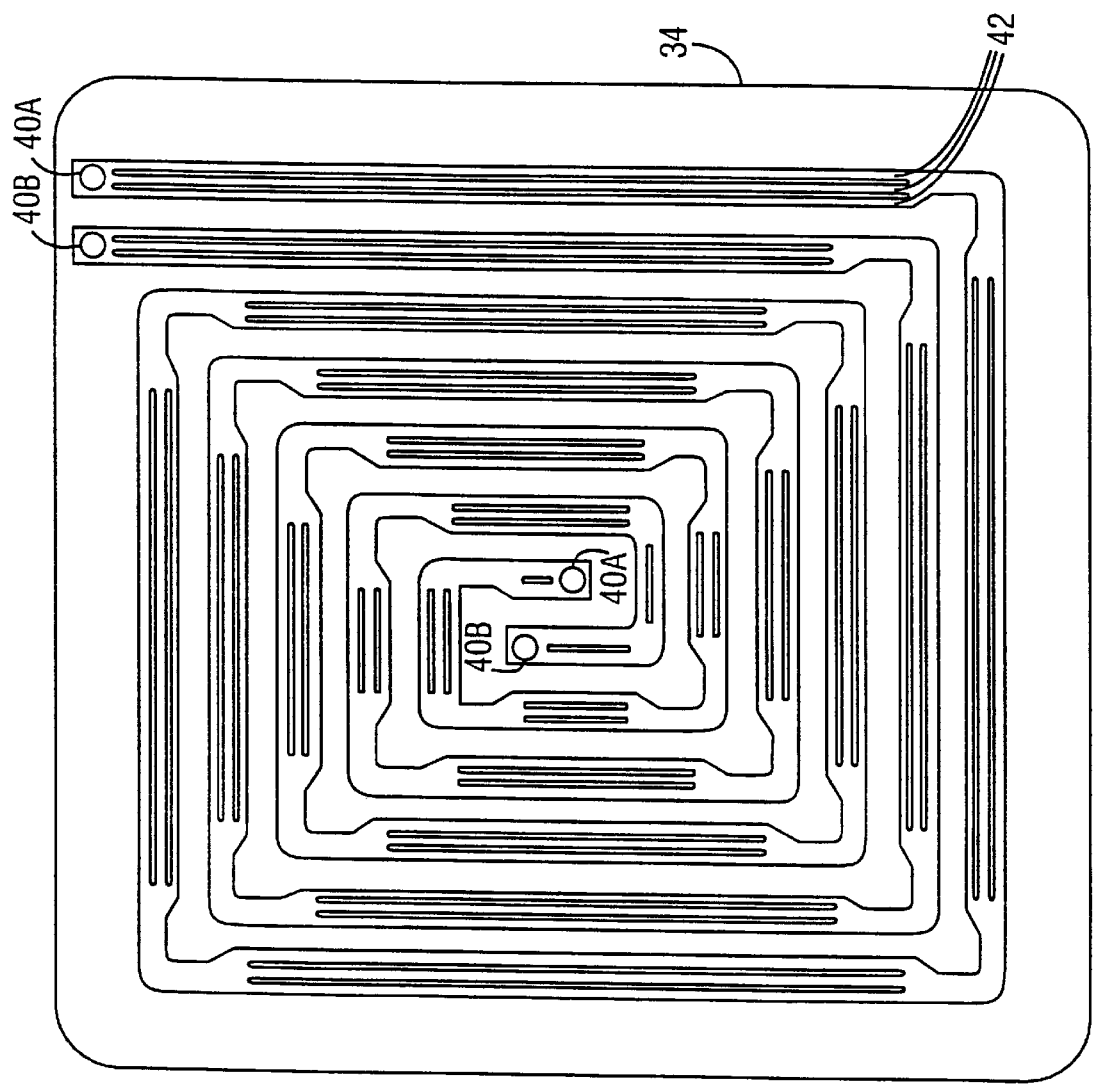
FIG. 2 is a top view of an arrangement of fluid channels in a preferred embodiment of the invention.

Referring to FIG. 2, the integrated bake and chill plate 34 is illustrated having fluid channels 40A and 40B and fluid inlets and fluid outlets through which thermally conductive fluid may flow for heating or cooling the thermally conductive plate. The temperature of the plate 30 is determined primarily by the temperature of the fluid flowing through channels 40A and 40B. The integrated bake and chill plate 34 is approximately 1 inch to 1½ inch thick and is composed of a material of relatively high thermal conductivity, such as a metal composed of copper or aluminum. Copper has preferable thermal properties, but aluminum is less expensive and simpler to manufacture. The integrated bake and chill plate 34 can be comprised of one solid plate with channels 40A and 40B formed within it or of two plates that are braised together and have indentations formed on their respective surfaces so that when joined the two plates create fluid channels 40A and 40B. The temperature of the thermally conductive plate 30 is determined primarily by the temperature of the fluid following through the integrated bake and chill plate 34. Any type of thermally conductive fluid can be used, but the preferred fluids are water for low temperatures or ethylene glycol, propylene glycol, or FLUORINERT™, which is manufactured by Minnesota Mining & Manufacturing Corporation, for higher temperatures. The layer of TEDs 32 provide improved control of the temperature of thermally conductive plate 30 and the different fluid temperatures combined with the low thermal mass allow the single plate 30 to be used for both heating and cooling.

Again referring to FIG. 2, channels 40A and 40B are illustrated having fluid-inlets and fluid-outlets near the center and near the perimeter of the integrated bake and chill plate. The fluid-inlets and fluid-outlets can be on the bottom surface of the integrated bake and chill plate or on the side surface. In a preferred embodiment, the perimeter fluid-inlets and fluid-outlets are on the side surface to avoid creating locations of concentrated heat and are on the bottom surface at the center. The parallel channels 40A and 40B form square pattern spirals as they extend gradually from the center of the integrated bake and chill plate 34 to the perimeter in a gradually receding manner. Other geometric spirals are appropriate as well. This design allows for several different patterns of fluid flow. First, fluid can flow from generally the perimeter of the integrated bake and chill plate 34 to generally the center in all channels or from generally the center of the integrated bake and chill plate 34 to generally the perimeter in all channels. Additionally, the fluid can flow in opposite directions (counterflow) in the different channels. These flow options improve the speed with which the integrated bake and chill plate's 34 temperature can change, thereby allowing for rapid heating and/or cooling, thereby improving the uniformity of heat transfer across the integrated bake and chill plate 34.

Channels 40A and 40B can also contain microchannels 42. The microchannels extend throughout the fluid channels. Preferably, the microchannels 42 increase the area of heat transfer across the integrated bake and chill plate 34, improve the rigidity of the integrated bake and chill plate 34 to reduce warping, and increase the velocity of the fluid through the channels for more rapid heating and cooling and overall better heat transfer. Ideally the microchannels will have a discontinuous phase at selected points in the fluid channels. In the preferred embodiment illustrated, the microchannels are discontinued at the corners to allow more uniform heat transfer.

The thermal cycling module is controlled in a preferred embodiment by feedback control loop, which includes a multivariable feedback controller. The feedback control loop regulates the substrate temperature during the thermal cycle by monitoring the temperature of the substrate and various process parameters with sensors, e.g. thermocouple sensors or infrared (IR) sensors or a process sensor such as a scatterometer. Sensors can be positioned to sense particular temperatures and/or process parameters at specific regions of the substrate. For example, IR sensors may be positioned above the substrate to detect infrared radiation from particular substrate regions. Similarly, thermocouple sensors may be placed in thermal contact with the substrate to sense substrate temperatures at particular substrate regions. The thermocouples are preferably imbedded in the thermally conductive plate. Specific techniques for measuring substrate temperatures and process parameters are well known in the art.

Based on electric signals sent by the sensors, a microprocessor in the controller calculates control signals for the TEDs and sends them to the variable power source, which is electrical contact with the TEDs 32 and controller. The variable power source changes flow of electric current through the TEDs in accordance with control signals received from the microprocessor. The microprocessor calculates and sends additional control signals to fluid supplies and to valves that control the flow of fluid through channels 40A and 40B of integrated bake and chill plate 34. The fluid then flows through the integrated bake and chill plate 34 to roughly determine the temperature of the entire plate 30 over longer time periods, while the TEDs 32 precisely determine local variations in the temperature of the plate at specific locations and determine the plate 30 temperature over short time intervals.

Typically, the present device is used through the specification of predetermined process parameters characteristic of the desired thermal cycle. For example, the controller may be programmed to start a substrate at 30° C. and quickly ramp it up to 80° C. for 60 seconds after which it is chilled to 10° C. for 30 seconds and then returned to 30° C. to complete the cycle. In this example, the controller sets fluid supplies to temperatures of 80° C., 30° C. and 10° C., respectively. Initially, the controller sets valves to permit only the 30° C. fluid to flow through the integrated bake and chill plate in a chosen flow pattern (either from the center of the integrated bake and chill plate 34 to the perimeter, from the perimeter of the integrated bake and chill plate 34 to the center, or alternating with some fluids flowing from the center to the perimeter and others flowing from the perimeter to the center). If any of the sensors indicate a temperature other than 30° C., then the controller sends a control signal to the variable power supply in order to appropriately heat or cool the appropriate plate region. In this manner, the temperature of the plate 30, and the substrate 38, is dynamically maintained at a uniform desired temperature.

At a specified point in time, the controller begins a transition phase to ramp the temperature from 30° C. to 80° C. At this point, the controller causes valves to permit only the 80° C. fluid to flow through the integrated bake and chill plate in a chosen flow pattern. In order to achieve more rapid temperature response, the controller sends control signals to the variable power source 36 that will send currents through TEDs 32 to rapidly heat the plate. Once the sensors indicate temperatures near 80° C., the transition phase is completed and the controller begins a baking phase where a uniform temperature of 80° C. is maintained through feedback in the same manner as the temperature was maintained at 30° C.

After baking the substrate for 60 seconds, the controller begins a second transition phase to ramp the temperature from 80° C. to 10° C. At this point, the controller causes valves to permit only 10° C. fluid to flow through the integrated bake and chill plate 34 in a desired flow pattern. The controller also sends control signals to the variable power supply that will send currents through the TEDs 32 to rapidly cool the plate. Once the sensors indicate temperatures of 10° C., the second transition phase is completed and the controller begins a chill phase where a uniform temperature of 10° C. is maintained through feedback.

After the chill phase is completed, the controller begins a third transition phase to ramp the temperature from 10° C. to 30° C. in a manner analogous to the transition phases described above. When the third transition is completed, the thermal cycle is complete.

Those skilled in the art can program the controller to execute many different thermal cycles involving any number of phases and transitions of different types. Additionally, the controller can be programmed by those skilled in the art to implement the described embodiments or any variations.

To improve the precision and uniformity of the plate's temperature, the present invention further comprises one or more thermoelectric devices (TEDs) in thermal contact with the thermally conductive plate. Because the TEDs may be quickly and precisely adjusted to heat the plate, they improve the control of the plate temperature and provide for shortened plate temperature transition times. Moreover, independently controlling an array of TEDs allows for compensation of spatial nonuniformities in substrate temperature that might arise. Alternatively, such independent control can provide intentional temperature nonuniformities if desired for special processing purposes.

The present invention also comprises a design facilitating easy replacement of individually damaged TEDs. The TEDs are attached with a connector, such as a screw or bolt, through a hole located in the center of the TED. This design also improves the electrical connection between the TED and a variable power source and the thermal connection between the thermally conductive plate and each TED.

Figure 3:
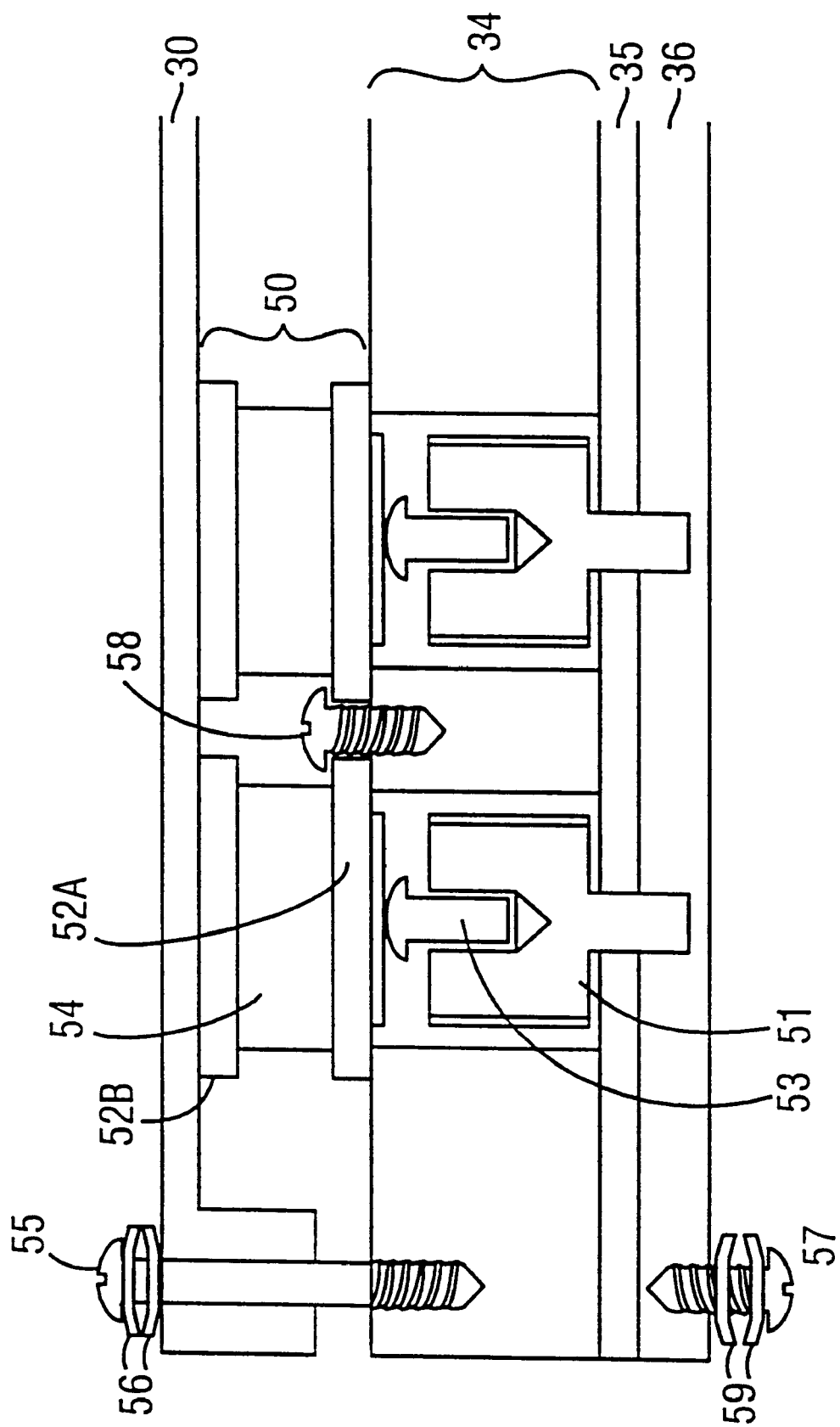
FIG. 3 is a cross-sectional view of a preferred embodiment of the invention.

Referring to FIG. 3, a cross-sectional view of a preferred embodiment of the is shown that illustrates how the integrated bake and chill plate 34 is in thermal and electric contact with the TED 32, PCB 36 and thermally conductive plate 30. The integrated bake and chill plate 34 and insulation layer 35 is illustrated having two holes or bores for each TED 32 for establishing an electrical connection with the PCB 36. The holes extend through the integrated bake and chill plate 34 and insulation layer 35 and are adapted to receive a support 51 made of copper or other suitable metal. A preferred support 51 has a cylindrical structure with a section having a smaller diameter at the bottom for inserting into and soldering to the PCB 36 which is powered by a variable power source. Anything that can be soldered to the support 51 and create an electrical connection with a variable power source can be used instead of a PCB 36 as well. A spring loaded pin 53 is inserted in the support for establishing an electrical connection between the TED 32 and PCB 36 and support 51. On the bottom surface of the TED 32 are copper pads 56, which when the TED 32 is secured to the integrated bake and chill plate 34, the pads 56 establish an electrical connection by depressing the spring loaded pin 53 into the support 51 soldered to the PCB 36.

The TEDs 32 comprise a lower plate 52A and upper plate 52B made of ceramic or other appropriate dielectric device with high electrical conductivity. The two plates are connected by a copper support structure 54 or other suitable metal structure and soldered together as shown in FIG. 5. Attached to the bottom of the lower plate 52A, are copper pads 56. Although the TED design shown in FIG. 5 is a preferred design, any type of TED can be used as long as the integrated bake and chill plate 34 and electrical connection means for connecting each TED to a variable power source are adapted accordingly.

As shown in FIG. 3, the TEDs 32 preferably are secured to the integrated bake and chill plate 34 with a screw, bolt or other connector 58 through a hole in the center of each TED 32. There are corresponding receiving holes on the integrated bake and chill plate 34 for receiving the connector 58. In a preferred embodiment, a Belleville washer is used to facilitate support and allow for vertical movement. Additionally, the TEDs are secured by the thermally conductive plate 30 which rests above the TEDs 32. Thermal grease can be placed on the top and bottom of the TEDs to improve the conductive interface between the thermally conductive plate and TEDs and between the TEDs and integrated bake and chill plate.

In a preferred embodiment, the thermally conductive plate 30 is connected to the PCB 36 with a screw, bolt or other connector 55. The connector 55 travels through a hole in the integrated bake and chill plate 34 to secure the top plate. Two Belleville washers 56 can be used, one upside down on top of the other, to handle vibration and thermal shock. Similarly, the PCB 36 can be connected to the integrated bake and chill plate 34 with a screw, bolt or other connector 57 as well. Again, in a preferred embodiment, two Belleville washers 59, one upside down on the other, can be used to handle thermal shock and vibrations.

Figure 4:
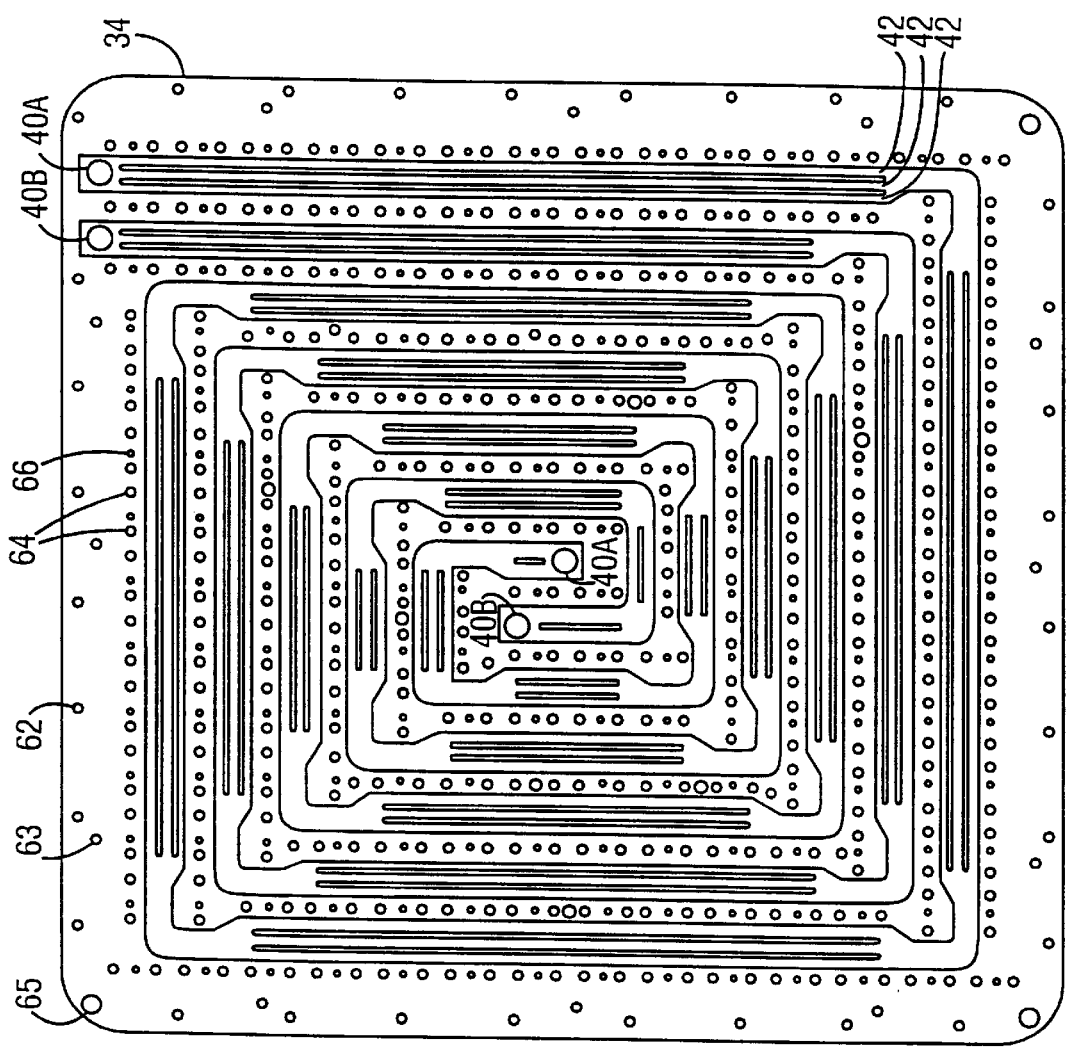
FIG. 4 is a top view of an arrangement of fluid channels and holes in the integrated bake and chill plate in a preferred embodiment of the invention.

FIG. 4 shows a top view of the integrated bake and chill plate and all of the locations of the mounting holes and TED support holes, as well as channels 40A and 40B for movement of fluids in a preferred embodiment. Hole 62 is a mounting hole location for the thermally conductive plate 30 and hole 63 is a mounting hole location for the PCB 36. Holes 64 are locations of the TED supports 51 and hole 64 is the location for the connector 58 that secures the TEDs 32 to the integrated bake and chill plate 34. Hole 65 accommodates a tooling pin to guide the integrated bake and chill plate 34 when placing it on the PCB 36. In a preferred embodiment, the fluid channels 40A and 40B have sufficient space between them to accommodate the TEDs 32 and the supports 51 and to facilitate braising of the two integrated bake and chill plate plates if the integrated bake and chill plate 34 comprises two plates yet maximize the area of heat transfer between the integrated bake and chill plate 34 and the TEDs 32.. A preferred number of TEDs 32 to cover the surface of the integrated bake and chill plate 34 is 196 TEDs 32 arranged in a 14×14 matrix or 100 TEDs 32 arranged in a 10×10 matrix.

What is claimed is:

1. An integrated bake and chill plate comprising:

an upper surface and a lower surface and one or more fluid conducting channels interposed between said upper and lower surfaces, at least one of said surfaces composed of thermally conducting material;

said fluid conducting channel having a first and a second end, said ends comprising either fluid-inlets or fluid-outlets for conducting fluid into and out of said channels;

said fluid conducting channel further comprising a plurality of microchannels extending through portions of said fluid conducting channel;

said channel interposed between said upper and lower surfaces such that one end of said channel extends from generally the center of said plate to the other end of said channel generally positioned at the perimeter of said plate in a generally spiraling arrangement.

2. The integrated bake and chill plate of claim 1 further comprising a plurality of fluid conducting channels, said channels positioned generally parallel to one another and extending generally from the center of said integrated bake and chill plate at one end to generally the perimeter of said integrated bake and chill plate at the other end in a generally spiraling arrangement.

3. A thermal cycling module comprising:

an integrated bake and chill plate comprising an upper surface and a lower surface and one or more fluid conducting channels interposed between said upper and lower surfaces, at least one of said surfaces composed of thermally conducting material;

said fluid conducting channel having a first and a second end, said ends comprising either fluid-inlets or fluid-outlets for conducing fluid into and out of said channels;

said channel interposed between said upper and lower surfaces such that one end of said channel extends from generally the center of said plate to the other end of said channel generally positioned at the perimeter of said plate in a generally spiraling arrangement; and one or more thermoelectric devices in thermal contact with said integrated bake and chill plate and each individually removably attached to said integrated bake and chill plate with a connector means.

4. The thermal cycling module of claim 3 wherein said fluid conducting channel of said integrated bake and chill plate further comprises a plurality of microchannels extending through portions of said fluid conducting channel.

5. The thermal cycling module of claim 4 wherein said integrated bake and chill plate comprises a plurality of fluid conducting channels, said channels positioned generally parallel to one another and extending generally from the center of said integrated bake and chill plate at one end to generally the perimeter of said integrated bake and chill plate at the other end in a generally spiraling arrangement.

6. The thermal cycling module of claim 3 further comprising a thermally conductive plate in thermal contact with said thermoelectric devices.

7. The thermal cycling module of claim 6 further comprising a first washer, a second washer and a connection means having a top, said connection means removably attaching said thermally conductive plate to said integrated bake and chill plate and said first washer being placed around said connection means and below said top of said connection means and said second washer being placed around said connection means and between said first washer and said thermally conductive plate.

8. The thermal cycling module of claim 6 wherein said thermally conductive plate further comprises a bottom surface and vertical extensions integrally connected to said bottom surface of said thermally conductive plate and wherein said integrated bake and chill plate further comprises a top surface and vertical ribs integrally connected to said top surface of said integrated bake and chill plate; said vertical extensions of said thermally conductive plate being in thermal contact with said vertical ribs of said integrated bake and chill plate.

9. A thermal cycling module of claim 4 further comprising a thermally conductive plate in thermal contact with said thermoelectric devices.

10. The thermal cycling module of claim 9 further comprising a first washer, a second washer, and a connection means having a top, said connection means removably attaching said thermally conductive plate to said integrated bake and chill plate and said first washer being placed around said connection means and below said top of said connection means and said second washer being placed around said connection means and between said first washer and said thermally conductive plate.

11. The thermal cycling module of claim 9 wherein said thermally conductive plate further comprises a bottom surface and vertical extensions integrally connected to said bottom surface of said thermally conductive plate and wherein said integrated bake and chill plate further comprises a top surface and vertical ribs integrally connected to said top surface of said integrated bake and chill plate; said vertical extensions of said thermally conductive plate being in thermal contact with said vertical ribs of said integrated bake and chill plate.

12. The thermoelectric device of claim 1 wherein said top plate and said bottom plate are composed of a ceramic material.

13. The thermoelectric device of claim 1 wherein said support is composed of a copper material.

14. The thermoelectric device of claim 1 wherein said pad is composed of a copper material.

15. A thermal cycling module for baking and chilling a material substrate, the module comprising:
   a integrated bake and chill plate having an upper surface and a lower surface and one or more fluid conducting channels interposed between said upper and lower surfaces, at least one of said surfaces composed of thermally conducting material;
   said fluid conducting channel having a first and a second end, said ends comprising either fluid-inlets or fluid-outlets for conducing fluid into and out of said channels;
   said fluid conducting channel having a plurality of micro-channels extending therethrough;
   said fluid conducting channel interposed between said upper and lower surfaces such that one end of said channels extends from generally the center of said integrated bake and chill plate to the other end of said channel generally positioned at the perimeter of said integrated bake and chill plate in a generally spiraling arrangement;
   one or more thermoelectric devices in thermal contact with said integrated bake and chill plate and each individually removably attached to said integrated bake and chill plate with a connecting means;
   said thermoelectric device having a top plate having an upper surface and
      a lower surface, a bottom plate having an upper surface and a lower surface, a support interposed between and in thermal contact with the lower surface of said top plate and the upper surface of said bottom plate, and one or more electrically conductive pads positioned below and in thermal contact with the lower surface of said bottom plate;
   wherein said top plate, said bottom plate and said support define a passageway therethrough to accept a connecting means;
   a thermally conductive plate in thermal contact with said thermoelectric device; and
   a variable power supply in electrical contact with the thermoelectric devices.

16. The thermal cycling module of claim 15 further comprising a printed circuit board in electrical contact with the variable power supply and thermoelectric devices.

17. The thermal cycling module of claim 15 further comprising a connection means having a top, a first washer, and a second washer, said connection means removably attaching said printed circuit board to said integrated bake and chill plate and said first washer being placed around said connection means and below said top of said connection means and said second washer being placed around said connection means and between said first washer and printed circuit board.

18. The thermal cycling module of claim 15 further comprising a first washer, a second washer, and a connection means having a top, connection means removably attaching said thermally conductive plate to said integrated bake and chill plate and said first washer being placed around said connection means and below said top of said connection means and said second washer being placed around said connection means and between said first washer and said thermally conductive plate.

19. The thermal cycling module of claim 15 wherein said thermally conductive plate further comprises a bottom surface and vertical extensions integrally connected to said bottom surface of said thermally conductive plate and wherein said integrated bake and chill plate further comprises a top surface and vertical ribs integrally connected to said top surface of said integrated bake and chill plate; said vertical extensions of said thermally conductive plate being in thermal contact with said vertical ribs of said integrated bake and chill plate.

* * * * *